(12) United States Patent
Ge (10) Patent No.: US 10,120,247 B2
(45) Date of Patent: Nov. 6, 2018

(54) MANUFACTURING METHOD FOR TFT SUBSTRATE AND TFT SUBSTRATE MANUFACTURED BY THE MANUFACTURING METHOD THEREOF

(71) Applicant: Shenzhen China Star Optoelectronics Technology Co., Ltd., Shenzhen (CN)

(72) Inventor: Shimin Ge, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 153 days.

(21) Appl. No.: 15/125,191

(22) PCT Filed: Apr. 21, 2016

(86) PCT No.: PCT/CN2016/079805
§ 371 (c)(1),
(2) Date: Sep. 12, 2016

(87) PCT Pub. No.: WO2017/166341
PCT Pub. Date: Oct. 5, 2017

(65) Prior Publication Data
US 2018/0149900 A1    May 31, 2018

(30) Foreign Application Priority Data

Mar. 30, 2016   (CN) .......................... 2016 1 0194250

(51) Int. Cl.
*H01L 29/12* (2006.01)
*G02F 1/1343* (2006.01)
(Continued)

(52) U.S. Cl.
CPC .......... *G02F 1/13439* (2013.01); *G02F 1/136* (2013.01); *G02F 1/1368* (2013.01);
(Continued)

(58) Field of Classification Search
None
See application file for complete search history.

(56) References Cited

U.S. PATENT DOCUMENTS

| 2015/0179679 | A1* | 6/2015 | Im ..................... H01L 21/02532 257/43 |
| 2016/0013415 | A1* | 1/2016 | Ren ..................... H01L 51/5271 257/40 |
| 2016/0351595 | A1* | 12/2016 | Dai ................... G02F 1/133512 |

FOREIGN PATENT DOCUMENTS

| CN | 103441128 A | 12/2013 |
| CN | 104617102 A | 5/2015 |

* cited by examiner

*Primary Examiner* — Kevin M Picardat
(74) *Attorney, Agent, or Firm* — Leong C. Lei (57) ABSTRACT

The invention provides an array substrate and a manufacturing method thereof. The array substrate comprises a substrate body, a common electrode, a light shield layer, an insulating layer, a polycrystalline silicon layer, a gate insulating layer, a gate electrode, a medium layer and a source-drain electrode. The array substrate is characterized in that the common electrode is formed on the substrate body, the light shield layer is positioned on the common electrode, the insulating layer is positioned on the light shield layer and the common electrode, and the gate electrode is connected with the common electrode through a through hole. The manufacturing method of the array substrate includes the steps: forming the patterned common electrode and the patterned light shield layer by one-time photomask and multiple etching after a transparent conducting layer and a first metal layer are formed on the substrate body, and saving one photomask; forming an electrode through hole communicated with the common electrode and the gate electrode after photomask and etching, and subsequently manufacturing the medium layer and the source-drain electrode. The whole process has seven photomasks, machining process steps of (Continued)

an array substrate tube are simplified, and the manufacturing cost of the array substrate is reduced.

8 Claims, 11 Drawing Sheets

(51) Int. Cl.
*G02F 1/136* (2006.01)
*H01L 21/77* (2017.01)
*H01L 27/12* (2006.01)
*G02F 1/1362* (2006.01)
*G02F 1/1368* (2006.01)
*H01L 21/425* (2006.01)
*H01L 29/786* (2006.01)
*H01L 27/32* (2006.01)

(52) U.S. Cl.
CPC .. *G02F 1/136209* (2013.01); *G02F 1/136286* (2013.01); *H01L 21/425* (2013.01); *H01L 21/77* (2013.01); *H01L 27/12* (2013.01); *H01L 27/124* (2013.01); *H01L 27/127* (2013.01); *H01L 27/1225* (2013.01); *H01L 27/1288* (2013.01); *H01L 29/78633* (2013.01); *H01L 29/78693* (2013.01); *G02F 1/134363* (2013.01); *G02F 2001/13685* (2013.01); *G02F 2001/134372* (2013.01); *G02F 2001/136236* (2013.01); *G02F 2001/136295* (2013.01); *G02F 2202/10* (2013.01); *H01L 27/3248* (2013.01)

MANUFACTURING METHOD FOR TFT SUBSTRATE AND TFT SUBSTRATE MANUFACTURED BY THE MANUFACTURING METHOD THEREOF

BACKGROUND OF THE INVENTION

1. Field of the Invention

The present invention relates to the field of display, and in particular to a manufacturing method for thin film transistor (TFT) substrate and TFT substrate manufactured by the manufacturing method thereof.

2. The Related Arts

As the display technology develops rapidly, the flat displays, such as liquid crystal display (LCD), has the advantages of thinness, low power-consumption, and no radiation, and are widely used in applications, such as, mobile phone, TV, personal digital assistant (PDA), digital camera, notebook PC, desktop PC, and so on, and becomes the mainstream display technology.

The majority of the LCD devices are of the backlight type, which comprises an LCD panel and a backlight module. The operation principle of the LCD device is to utilize the liquid crystal placed between two parallel glass substrates. By using a voltage to a plurality of horizontal and vertical wires disposed between the two glass substrates to control the rotation of liquid crystal to refract the light emitted from the backlight module to display an image.

The traditional structure of the LCD panel comprises a color filter (CF) substrate, a TFT substrate, a liquid crystal (LC) layer sandwiched between two substrates, and a sealant. The manufacturing process usually comprises an array process (thin film, lithography, etching and film peeling), a cell process (attachment of TFT substrate to CF substrate) and a module assembly process (laminating driver IC and printed circuit board (PCB)), wherein the array process is to form TFT substrate for controlling the motion of LC molecules; the cell process is to adding the LC between the TFT substrate and CF substrate; and the module assembly process is to laminate the driver IC and integrate the PB so as to drive the LC molecules to rotate and display the image.

The active matrix driving LCD display technology utilizes bipolar polarization characteristics of the LC by applying an electric field to control the orientations of LC molecules to achieve the switching on the optical path of the backlight. Based on the direction of the applied electric field on the LC molecules, the LCD display mode can be categorized as twisted nematic (TN) type, vertical alignment (VA) type, and in-plane switching (IPS) type. The VA type applies a vertical electric field to the LC molecules, and the IPS type applies a horizontal electric filed to the LC molecules. In the IPS type, based on different types of horizontal electric filed being applied, the IPS type can further be divided into an IPS mode and fringe field switching (FFS) mode, wherein in the FFS mode, each pixel unit comprises an upper layer electrode and a lower layer electrode, i.e., the pixel electrode and the common electrode. The common electrode at the lower layer uses a flat surfacing manner for the opening area. FFS mode displays has the advantages of high transmittance, wide viewing angle and low color shift, and is a widely used in LCD display technology.

With the development of large size and high pixels-per-inch (PPI), and high refresh frequency products, indium gallium zinc oxide (IGZO), which is the representative of an oxide semiconductor, receives widespread attention and application due to the high mobility. For a top-gate coplanar type TFT structure, the self-alignment process can greatly reduce the parasitic capacitance of the gate electrode and the source and drain, and thereby improving the resistor-capacitor (RC) delay. Moreover, the semiconductor channel length of a top-gate coplanar type TFT structure can also be made shorter, thus more suitable for the development and application of high PPI. Since the channel of the top-gate coplanar type TFT is susceptible to light from downward, the TFT electrical stability may deteriorate. Therefore, a light-shielding layer must be added to the region. However, the conventional manufacturing method for FFS mode array substrate requires more number of mask processes, more complicated process, and leading to higher production cost.

SUMMARY OF THE INVENTION

The object of the present invention is to provide a manufacturing method for TFT substrate, able to reduce the number of mask processes, improve production efficiency and reduce production cost.

Another object of the present invention is to provide a TFT substrate, with simple manufacturing process and low production cost and providing high electrical performance.

To achieve the above object, the present invention provides a manufacturing method for TFT substrate, which comprises:

Step 1: providing a substrate, and then sequentially depositing a transparent conductive film and a light-shielding film on the substrate;

Step 2: using a semi-permeable mask on the transparent conductive film and the light-shielding film for patterning process to obtain a transparent conductive layer and a common electrode spaced apart on the substrate, and a light-shielding layer over the transparent conductive layer with equal width and aligned at two ends;

Step 3: depositing a buffer layer on the light-shielding layer, the common electrode, and the substrate, and then sequentially depositing an oxide semiconductor layer, an insulating layer, and a gate metal layer on the buffer layer;

Step 4: using a mask on the gate metal layer and the insulating layer for patterning process to obtain a gate and a gate insulating layer with the same width and aligned at two ends;

using the gate and the gate insulating layer as a shielding layer to perform ion doping on the oxide semiconductor layer to convert the region of the oxide semiconductor layer not covered by the gate and the gate insulating layer into oxide conductor;

Step 5: using a mask on the oxide semiconductor layer for patterning process to form an active layer and a pixel electrode connected to the active layer;

the active layer comprising a channel region underneath the gate, a drain contact region located at one side of the channel region, a connection area located at the other side of the channel region and connected to the pixel electrode; wherein the channel region of the active layer being made of an oxide semiconductor material, the drain contact region and the connection region of the active layer, and the pixel electrode being made of an oxide conductor;

Step 6: depositing a first passivation layer on the gate, the active layer and the buffer layer, using a mask on the first passivation layer for patterning process to form a via on the first passivation layer corresponding to the drain contact region; and Step 7: depositing a drain metal layer on the first passivation layer, using a mask on the drain metal layer for patterning process to obtain a drain, the drain contacting the drain contact region of the active layer through the via, depositing a second passivation layer on the drain and the first passivation layer to form a TFT substrate.

Step 2 further comprises:

Step 21: coating a photoresist layer on the light-shielding film, using a semi-permeable mask on the photoresist layer for patterning process to obtain a first photoresist section and a second photoresist section spaced apart; the first photoresist section having a thickness greater than the thickness of the second photoresist section;

Step 22: using the first photoresist section and the second photoresist section as a stopping layer to perform etching on the transparent conductive film and the light-shielding film to obtain the light-shielding layer and the transparent conductive layer beneath the first photoresist section, and a light-shielding section and the common electrode underneath the second photoresist section;

Step 23: performing an ashing treatment on the first and the second photoresist sections for thinning the first photoresist section and removing the second photoresist section;

Step 24: using the first photoresist section as a stopping layer to perform etching on the light-shielding section to remove the light-shielding section; and Step 25: removing the remaining first photoresist section.

In Step 2, the semi-permeable mask is a gray tone mask, half tone mask or single slit mask.

In Step 4, the ion doping performed on the oxide semiconductor is through plasma treatment.

In Step 5, the oxide semiconductor is a transparent metal oxide semiconductor material, and the oxide conductor is an ion-doped transparent metal oxide semiconductor material.

The present invention also provides a TFT substrate, which comprises: a substrate, a transparent conductive layer and a common electrode disposed on the substrate and spaced apart, a light-shielding layer disposed on the transparent conductive layer and having equal width and aligned at two ends, a buffer layer disposed on the light-shielding layer, the common electrode, and the substrate, an active layer and a pixel electrode disposed on the buffer layer, a gate insulating layer disposed on the active layer, a gate disposed on the gate insulating layer having equal width and aligned at two ends, a first passivation layer disposed on the gate, the active layer, the pixel electrode, and the buffer layer, a drain disposed on the first passivation layer, and a second passivation layer disposed on the drain and the first passivation layer;

the active layer comprising a channel region underneath the gate, a drain contact region located at one side of the channel region, a connection area located at the other side of the channel region and connected to the pixel electrode; wherein the channel region of the active layer being made of an oxide semiconductor material, the drain contact region and the connection region of the active layer being made of an oxide conductor;

the first passivation layer being disposed with a via corresponding to the drain contact region, the drain contacting the drain contact region of the active layer through the via.

The oxide semiconductor is a transparent metal oxide semiconductor material, and the oxide conductor is an ion-doped transparent metal oxide semiconductor material.

The transparent metal oxide semiconductor material is an amorphous indium gallium zinc oxide.

The material of the common electrode and the transparent conductive layer is a transparent conductive metal oxide.

The buffer layer is an insulating film with a high transmittance.

The present invention also provides a manufacturing method for TFT substrate, which comprises:

Step 1: providing a substrate, and then sequentially depositing a transparent conductive film and a light-shielding film on the substrate;

Step 2: using a semi-permeable mask on the transparent conductive film and the light-shielding film for patterning process to obtain a transparent conductive layer and a common electrode spaced apart on the substrate, and a light-shielding layer over the transparent conductive layer with equal width and aligned at two ends;

Step 3: depositing a buffer layer on the light-shielding layer, the common electrode, and the substrate, and then sequentially depositing an oxide semiconductor layer, an insulating layer, and a gate metal layer on the buffer layer;

Step 4: using a mask on the gate metal layer and the insulating layer for patterning process to obtain a gate and a gate insulating layer with the same width and aligned at two ends;

using the gate and the gate insulating layer as a shielding layer to perform ion doping on the oxide semiconductor layer to convert the region of the oxide semiconductor layer not covered by the gate and the gate insulating layer into oxide conductor;

Step 5: using a mask on the oxide semiconductor layer for patterning process to form an active layer and a pixel electrode connected to the active layer;

the active layer comprising a channel region underneath the gate, a drain contact region located at one side of the channel region, a connection area located at the other side of the channel region and connected to the pixel electrode; wherein the channel region of the active layer being made of an oxide semiconductor material, the drain contact region and the connection region of the active layer, and the pixel electrode being made of an oxide conductor;

Step 6: depositing a first passivation layer on the gate, the active layer and the buffer layer, using a mask on the first passivation layer for patterning process to form a via on the first passivation layer corresponding to the drain contact region; and Step 7: depositing a drain metal layer on the first passivation layer, using a mask on the drain metal layer for patterning process to obtain a drain, the drain contacting the drain contact region of the active layer through the via, depositing a second passivation layer on the drain and the first passivation layer to form a TFT substrate;

wherein Step 2 further comprising:

Step 21: coating a photoresist layer on the light-shielding film, using a semi-permeable mask on the photoresist layer for patterning process to obtain a first photoresist section and a second photoresist section spaced apart; the first photoresist section having a thickness greater than the thickness of the second photoresist section;

Step 22: using the first photoresist section and the second photoresist section as a stopping layer to perform etching on the transparent conductive film and the light-shielding film to obtain the light-shielding layer and the transparent conductive layer beneath the first photoresist section, and a light-shielding section and the common electrode underneath the second photoresist section;

Step 23: performing an ashing treatment on the first and the second photoresist sections for thinning the first photoresist section and removing the second photoresist section;

Step 24: using the first photoresist section as a stopping layer to perform etching on the light-shielding section to remove the light-shielding section; and Step 25: removing the remaining first photoresist section; wherein in Step 2, the semi-permeable mask being a gray tone mask, half tone mask or single slit mask.

Compared to the known techniques, the present invention provides the following advantages: the present invention provides a manufacturing method for TFT substrate, by using the transparent metal oxide metal oxide material characterized by high visible light transmittance and the doping treatment of transparent metal oxide semiconductor to convert into the transparent metal oxide conductor to form simultaneously the active layer and the pixel electrode, to reduce the number of masks, improve production efficiency and reduce the production cost; moreover, the use of only a semi-permeable mask for exposure and etching to form the common electrode and a stacked light-shielding layer of light-shielding layer and transparent conductive layer can further reduce the number of masks, the electric stability influenced by light is avoided by disposing the light shielding layer below the TFT. The present invention provides a TFT substrate, manufactured by using the transparent metal oxide metal oxide material characterized by high visible light transmittance and the doping treatment of transparent metal oxide semiconductor to convert into the transparent metal oxide conductor to form simultaneously the active layer and the pixel electrode, wherein the manufacturing process is simple, low production cost, and the light-shielding layer is provided below the TFT to avoid the light to influence of TFT electrical stability.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
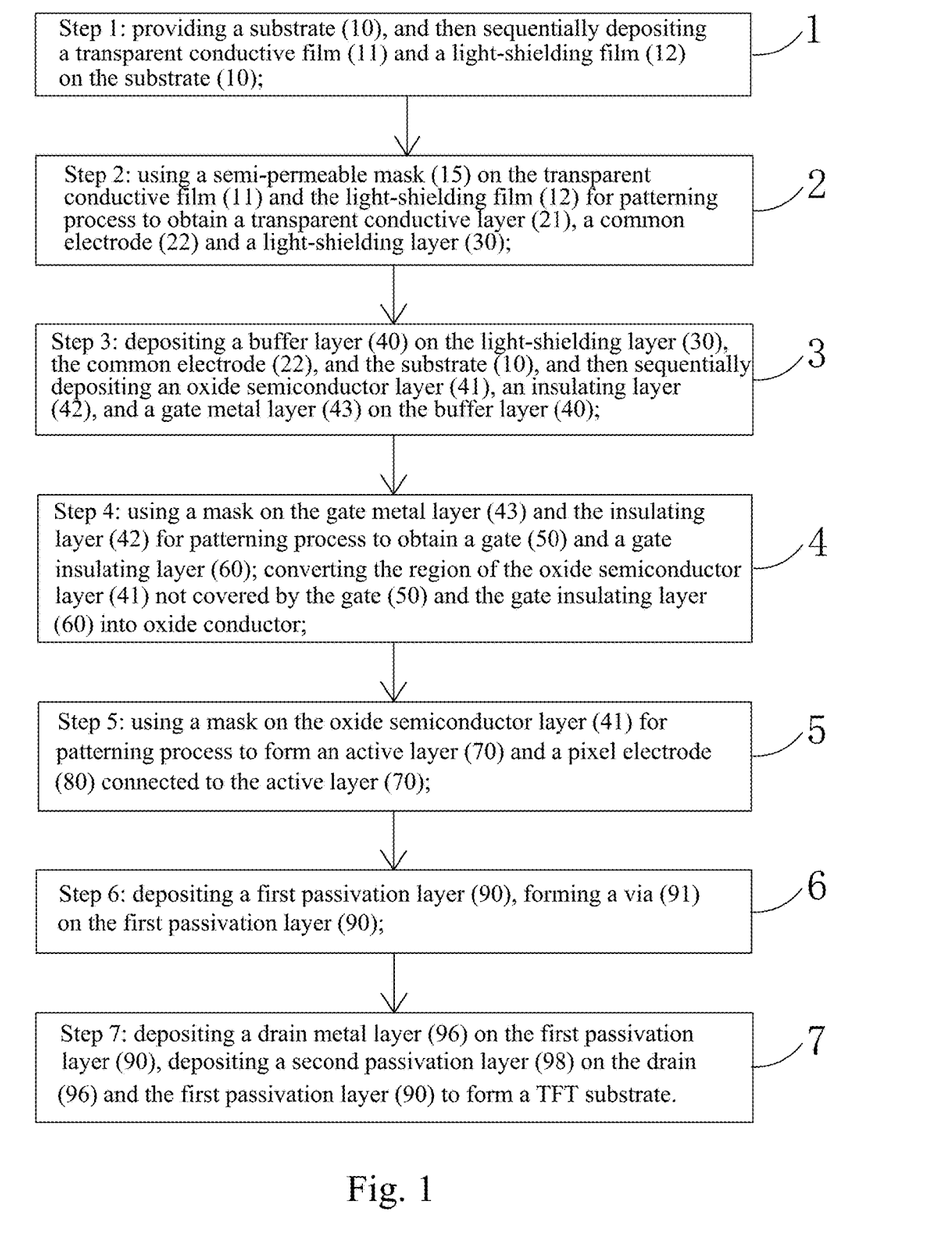
FIG. 1 is a schematic view showing the flowchart of the manufacturing method for TFT substrate provided by an embodiment of the present invention.
Figure 2:
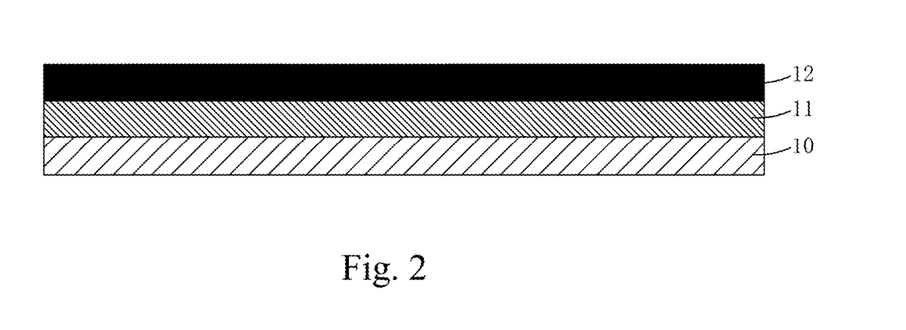
FIG. 2 is a schematic view showing Step 1 of the manufacturing method for TFT substrate provided by an embodiment of the present invention.

Refer to FIG. 1. The present invention provides a manufacturing method for TFT substrate, which comprises:

Step 1: as shown in FIG. 2, providing a substrate 10, and then sequentially depositing a transparent conductive film 11 and a light-shielding film 12 on the substrate 10.

Specifically, the substrate 10 is a transparent substrate, preferably a glass substrate.

Specifically, in Step 1, the substrate 10 is washed and cleaned before depositing the transparent conductive film 11.

Specifically, the transparent conductive film 11 is made of a transparent conductive metal oxide material, such as one or more of stacked layers of indium tin oxide (ITO), indium zinc oxide (IZO), aluminum zinc oxide, aluminum zinc oxide, indium-zinc-germanium oxide. Preferably, the material of the transparent conductive film 11 is indium tin oxide (ITO).

Specifically, the light-shielding film 12 is made of a metal, preferably one or more stacked combination of molybdenum (Mo), titanium (Ti), aluminum (Al), copper (Cu).

Step 2: as shown in FIGS. 3-7, using a semi-permeable mask 15 on the transparent conductive film 11 and the light-shielding film 12 for patterning process to obtain a transparent conductive layer 21 and a common electrode 22 spaced apart on the substrate 10, and a light-shielding layer 30 over the transparent conductive layer 21 with equal width and aligned at two ends.

Figure 3:
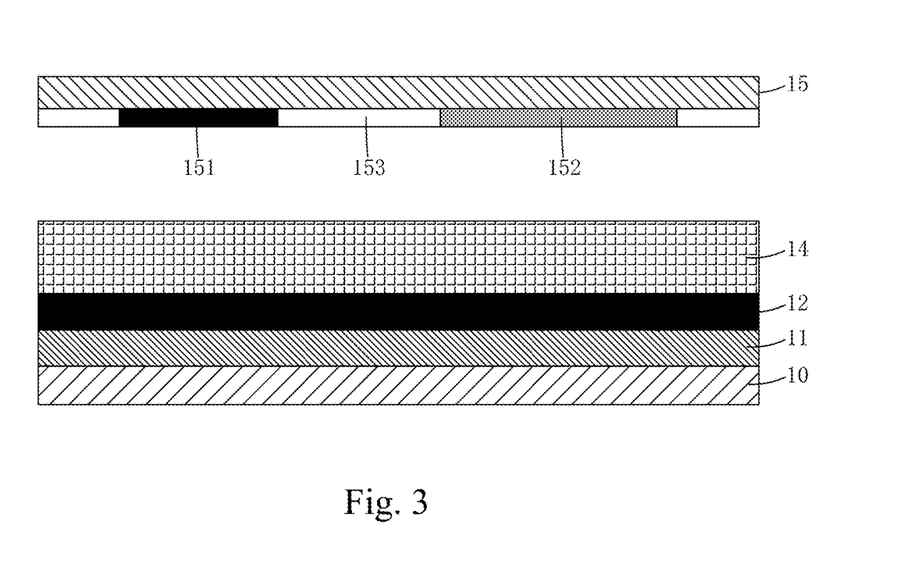
FIGS. 3-7 are schematic views showing Step 2 of the manufacturing method for TFT substrate provided by an embodiment of the present invention.
Figure 4:
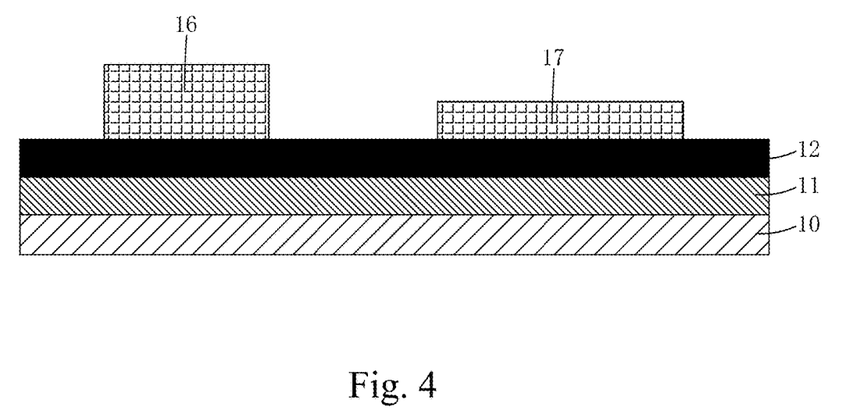

Specifically, Step 2 further comprises:

Step 21: as shown in FIGS. 304, coating a photoresist layer 14 on the light-shielding film 12, using a semi-permeable mask 15 on the photoresist layer 14 for patterning process to obtain a first photoresist section 16 and a second photoresist section 17 spaced apart; the first photoresist section 16 having a thickness greater than the thickness of the second photoresist section 17.

Figure 5:
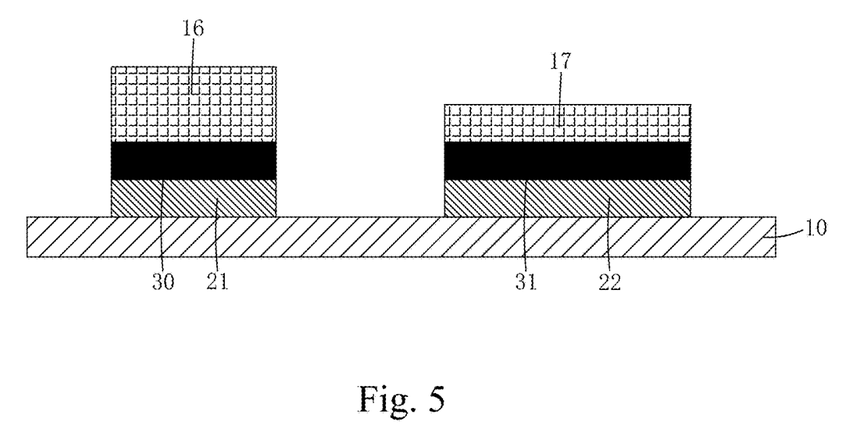

Step 22: as shown in FIG. 5, using the first photoresist section 16 and the second photoresist section 17 as a stopping layer to perform etching on the transparent conductive film 11 and the light-shielding film 12 to obtain the light-shielding layer 30 and the transparent conductive layer 21 beneath the first photoresist section 16, and a light-shielding section 31 and the common electrode 22 underneath the second photoresist section 17.

Figure 6:
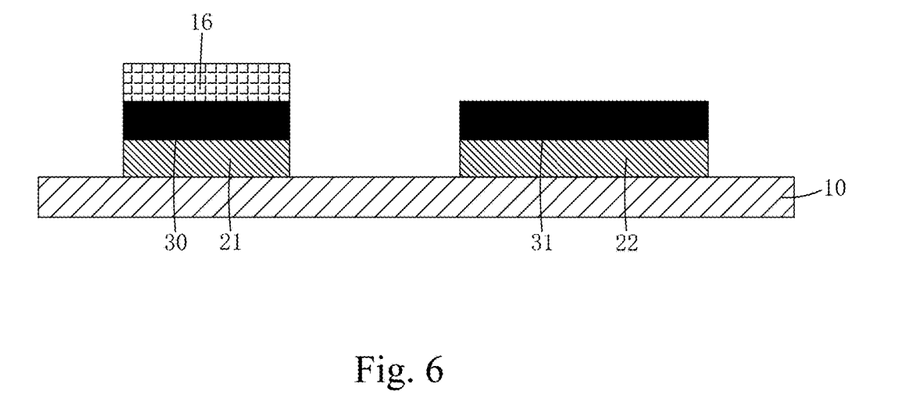

Step 23: as shown in FIG. 6, performing an ashing treatment on the first and the second photoresist sections 16, 17 for thinning the first photoresist section 16 and removing the second photoresist section 17.

Figure 7:
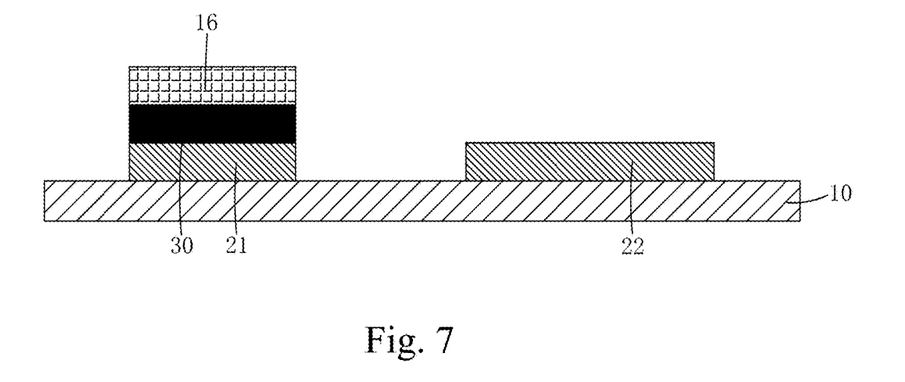

Step 24: as shown in FIG. 7, using the first photoresist section 16 as a stopping layer to perform etching on the light-shielding section 31 to remove the light-shielding section 31/

Figure 8:
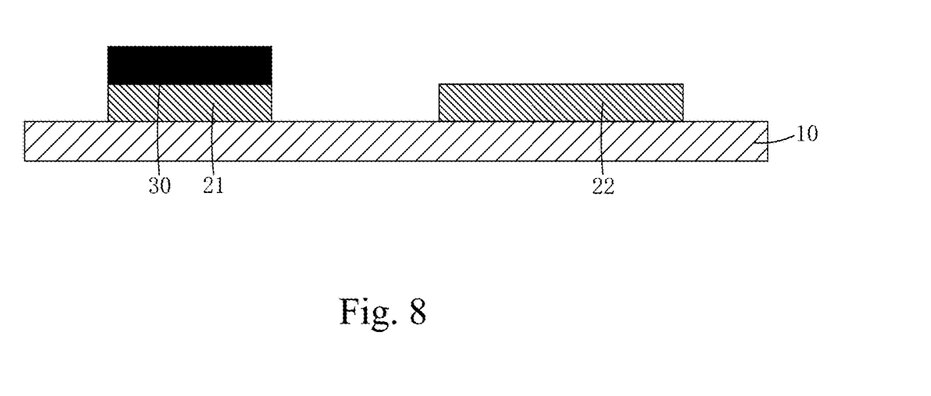
FIG. 8 is a schematic view showing Step 3 of the manufacturing method for TFT substrate provided by an embodiment of the present invention.

Step 25: as shown in FIG. 8, removing the remaining first photoresist section 16.

Specifically, in Step 21, the thickness of the first photoresist section 16 is 1.5-3 µm, the thickness of the second photoresist section is 0.15-1 µm.

Specifically, the semi-permeable mask 15 is disposed with a non-transmissive region 151 corresponding to the first photoresist section 16, a semi-transparent region 152 corresponding to the second photoresist section 17, and a fully transmissive region 153 other than the non-transmissive region 11 and the semi-transparent region 152. The photoresist layer 14 is made of a positive resist material.

Moreover, the semi-permeable mask 15 is a gray tone mask (GTM), half tone mask (HTM) or single slit mask (SSM).

Specifically, in Step 23, oxygen is used in the ashing treatment on the first photoresist section 16 and the second photoresist section 17.

Figure 9:
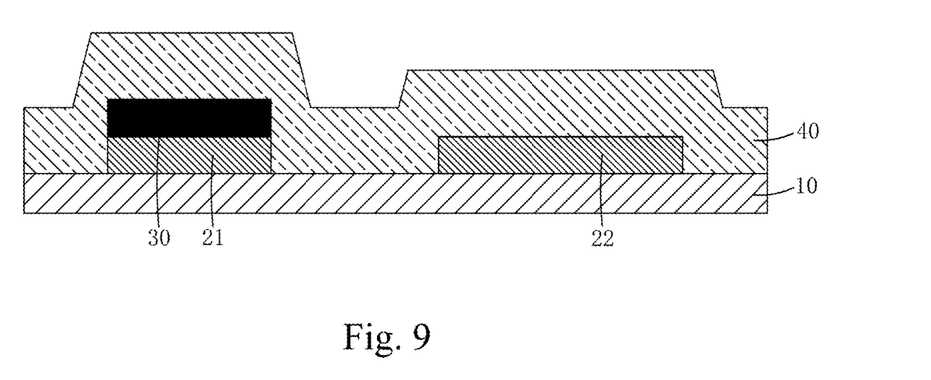
FIGS. 9-12 are schematic views showing Step 4 of the manufacturing method for TFT substrate provided by an embodiment of the present invention.

Step 3: as shown in FIG. 9, depositing a buffer layer 40 on the light-shielding layer 30, the common electrode 22, and the substrate 10, and then sequentially depositing an oxide semiconductor layer 41, an insulating layer 42, and a gate metal layer 43 on the buffer layer 40.

Preferably, the buffer layer 40 is an insulating film with a high transmittance; specifically, the insulating film is a silicon oxide (SiOx) layer, a silicon nitride (SiNx) layer, or a stacked compound layer formed by silicon oxide layer and silicon nitride layer.

Specifically, the material for the oxide semiconductor layer 41 is a transparent metal oxide semiconductor material, and preferably, an amorphous indium gallium zinc oxide (IGZO); the oxide semiconductor layer 41 is obtained by depositing with a sputtering device at room temperature.

Specifically, the insulating layer 42 is a silicon oxide (SiOx) layer, a silicon nitride (SiNx) layer, or a stacked compound layer formed by silicon oxide layer and silicon nitride layer.

Specifically, the gate metal layer 43 is made of one or more stacked combination of molybdenum (Mo), aluminum (Al), copper (Cu), and titanium (Ti).

Figure 10:
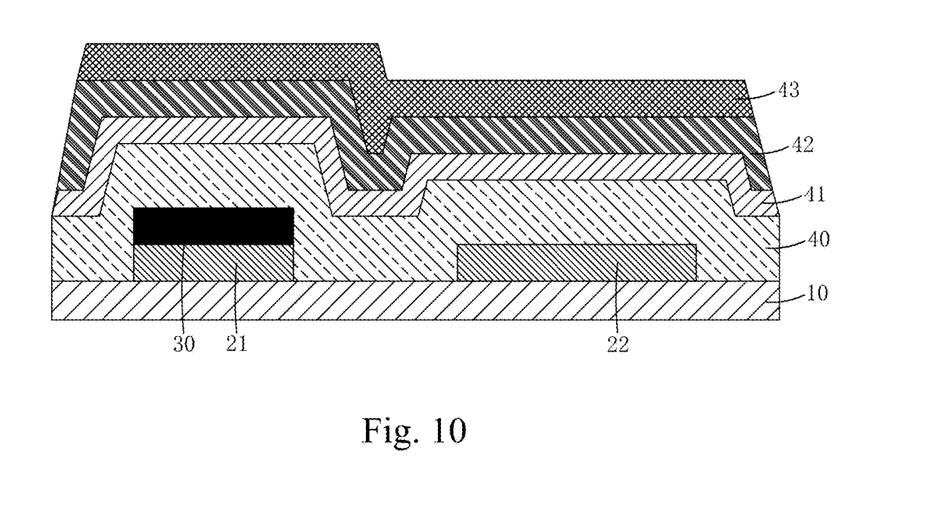
Figure 11:
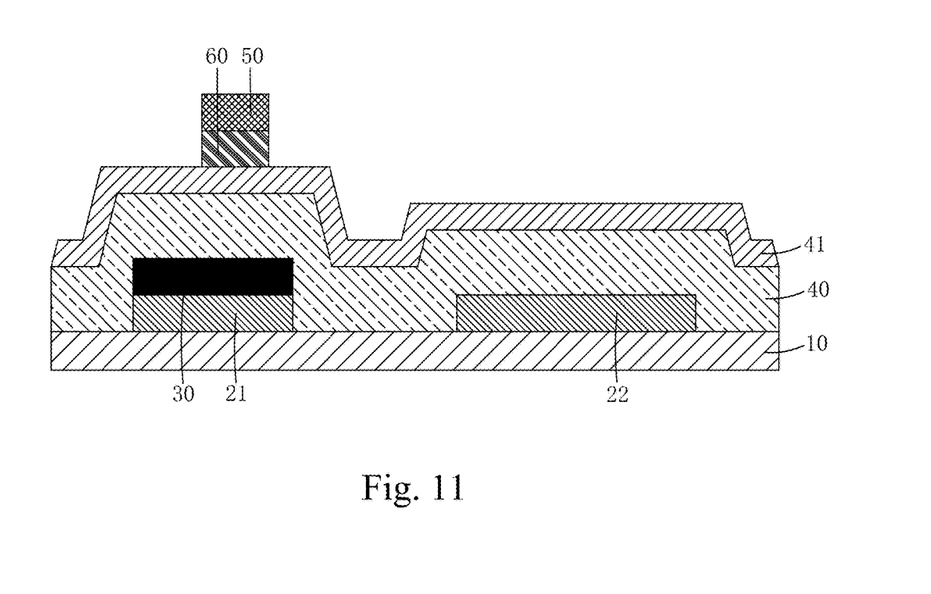
Figure 12:
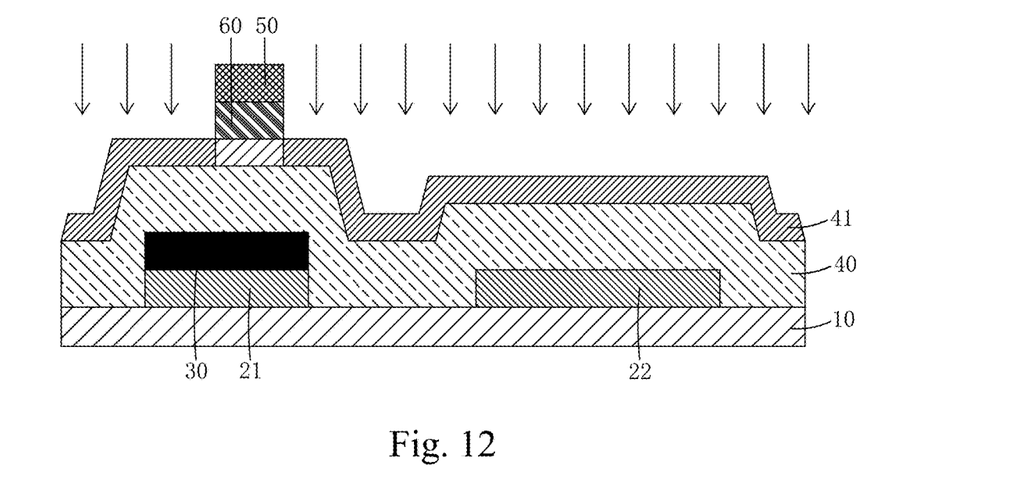

Step 4: as shown in FIGS. 10-12, using a mask on the gate metal layer 43 and the insulating layer 42 for patterning process to obtain a gate 50 and a gate insulating layer 60 with the same width and aligned at two ends; using the gate 50 and the gate insulating layer 60 as a shielding layer to perform ion doping on the oxide semiconductor layer 41 to convert the region of the oxide semiconductor layer 41 not covered by the gate 50 and the gate insulating layer 50 into oxide conductor.

Specifically, in Step 4, the ion doping performed on the oxide semiconductor 41 is through plasma treatment. Specifically, the plasma can be a plasma of hydrogen, ammonia, or argon.

Figure 13:
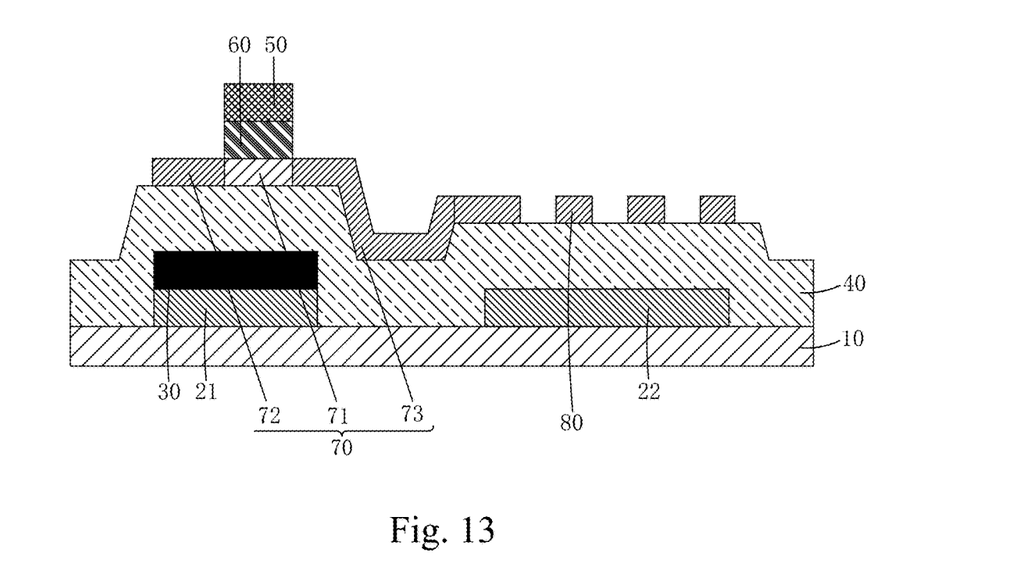
FIG. 13 is a schematic view showing Step 5 of the manufacturing method for TFT substrate provided by an embodiment of the present invention.

Step 5: as shown in FIG. 13, using a mask on the oxide semiconductor layer 41 for patterning process to form an active layer 70 and a pixel electrode 80 connected to the active layer 70; the active layer 70 comprising a channel region 71 underneath the gate 50, a drain contact region 72 located at one side of the channel region 71, a connection area 73 located at the other side of the channel region 71 and connected to the pixel electrode 80; wherein the channel region 71 of the active layer 70 being made of an oxide semiconductor material, the drain contact region 72 and the connection region 73 of the active layer 70 and the pixel electrode 80 being made of an oxide conductor.

Specifically, the oxide semiconductor is a transparent metal oxide semiconductor material, and the oxide conductor is an ion-doped transparent metal oxide semiconductor material. Preferably, the transparent metal oxide semiconductor material is amorphous indium gallium zinc oxide (IGZO).

The present invention uses Step 4 and Step 5 to obtain the active layer 70 and the pixel electrode 80 located at the same layer. The pixel electrode 80 is directly connected to the active layer 70, without the need to dispose a source. As such, the manufacturing process is simplified and the production cost is reduced.

Figure 14:
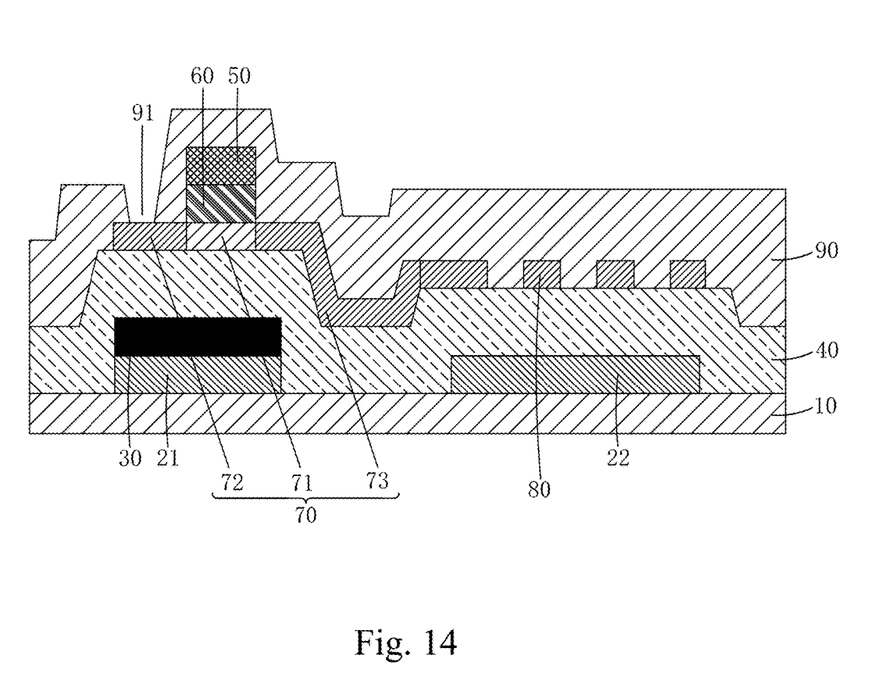
FIG. 14 is a schematic view showing Step 6 of the manufacturing method for TFT substrate provided by an embodiment of the present invention.

Step 6: as shown in FIG. 14, depositing a first passivation layer 90 on the gate 50, the active layer 70 and the buffer layer 40, using a mask on the first passivation layer 90 for patterning process to form a via 91 on the first passivation layer 90 corresponding to the drain contact region 72.

Specifically, the first passivation layer 90 is a silicon oxide (SiOx) layer, a silicon nitride (SiNx) layer, or a stacked compound layer formed by silicon oxide layer and silicon nitride layer.

Figure 15:
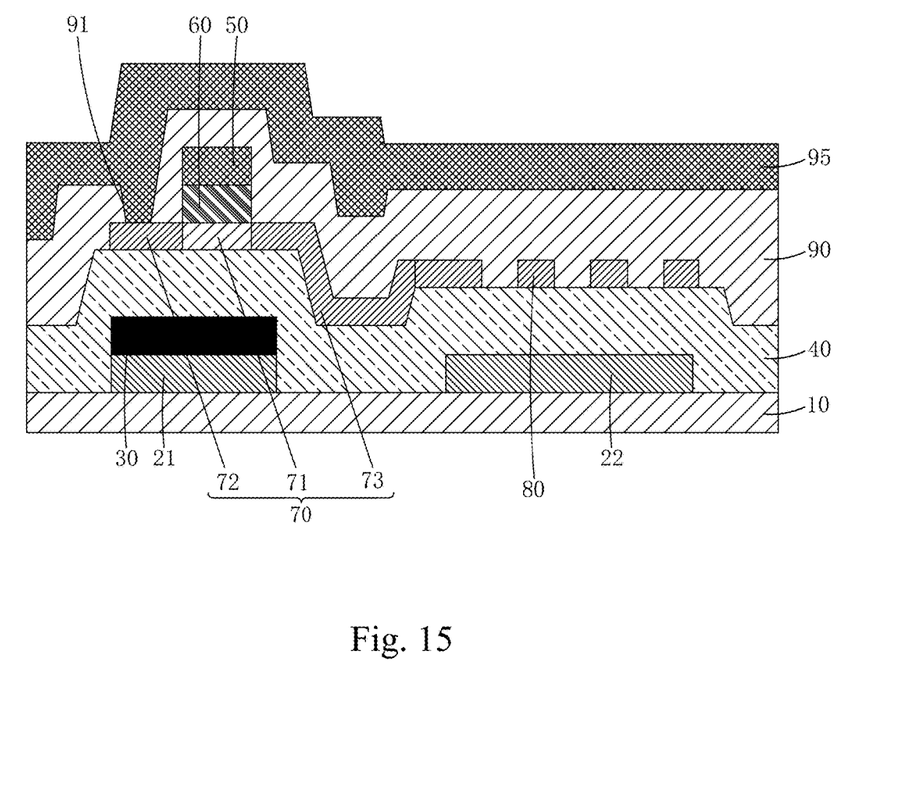
FIGS. 15-16 are schematic views showing Step 7 of forming the drain in the manufacturing method for TFT substrate provided by an embodiment of the present invention.
Figure 16:
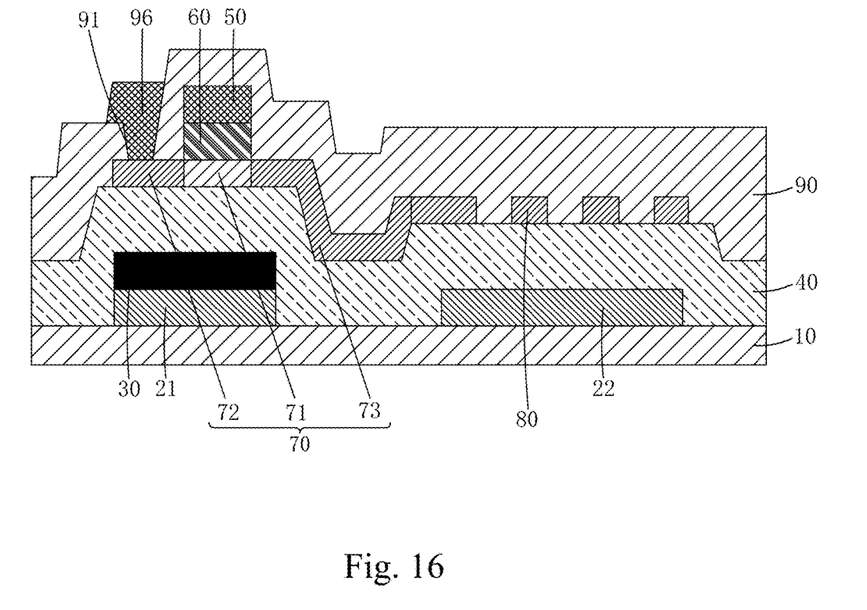
Figure 17:
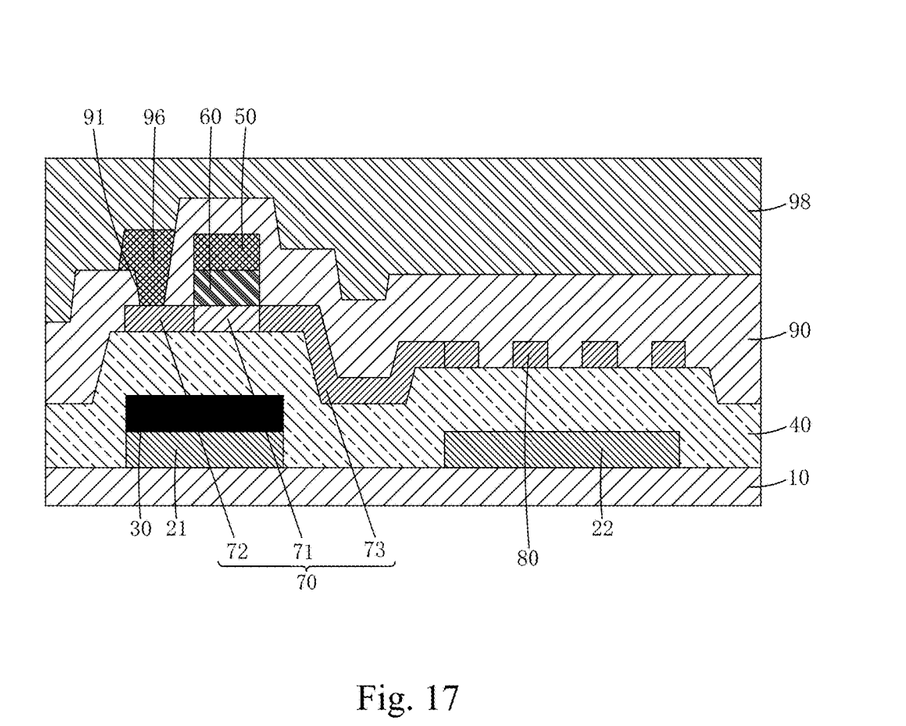
FIG. 17 is a schematic view showing Step 7 of forming the second passivation layer in the manufacturing method for TFT substrate and the structure of the TFT substrate provided by an embodiment of the present invention.

Step 7: as shown in FIGS. 15-17, depositing a drain metal layer 95 on the first passivation layer 90, using a mask on the drain metal layer 95 for patterning process to obtain a drain 96, the drain 96 contacting the drain contact region 72 of the active layer 70 through the via 91, depositing a second passivation layer 98 on the drain 96 and the first passivation layer 90 to form a TFT substrate.

Specifically, the drain metal layer 95 is made of one or more stacked combination of molybdenum (Mo), aluminum (Al), copper (Cu), and titanium (Ti).

Specifically, the second passivation layer 98 is a silicon oxide (SiOx) layer, a silicon nitride (SiNx) layer, or a stacked compound layer formed by silicon oxide layer and silicon nitride layer.

The above manufacturing method for TFT substrate uses the transparent metal oxide metal oxide material characterized by high visible light transmittance and the doping treatment of transparent metal oxide semiconductor to convert into the transparent metal oxide conductor to form simultaneously the active layer and the pixel electrode, to reduce the number of masks, improve production efficiency and reduce the production cost; moreover, the use of only a semi-permeable mask for exposure and etching to form the common electrode and a stacked light-shielding layer of light-shielding layer and transparent conductive layer can further reduce the number of masks, the electric stability influenced by light is avoided by disposing the light shielding layer below the TFT.

Refer to FIG. 17. The present invention also provides a TFT substrate, which comprises: a substrate 10, a transparent conductive layer 21 and a common electrode 22 disposed spaced apart on the substrate 10, a light-shielding layer 30 disposed on the transparent conductive layer 21 and having equal width and aligned at two ends, a buffer layer 40 disposed on the light-shielding layer 30, the common electrode 22, and the substrate 10, an active layer 70 and a pixel electrode 80 disposed on the buffer layer 40, a gate insulating layer 60 disposed on the active layer 70, a gate 50 disposed on the gate insulating layer 60 having equal width and aligned at two ends, a first passivation layer 90 disposed on the gate 50, the active layer 70, the pixel electrode 80, and the buffer layer 40, a drain 96 disposed on the first passivation layer 90, and a second passivation layer 98 disposed on the drain 96 and the first passivation layer 90.

The active layer 70 comprises a channel region 71 underneath the gate 50, a drain contact region 72 located at one side of the channel region 71, a connection area 73 located at the other side of the channel region 71 and connected to the pixel electrode 80; wherein the channel region 71 of the active layer 70 is made of an oxide semiconductor material, the drain contact region 72 and the connection region 73 of the active layer 70, and the pixel electrode 80 are made of an oxide conductor.

The first passivation layer 90 is disposed with a via 91 corresponding to the drain contact region 72, and the drain 96 contacts the drain contact region 72 of the active layer 70 through the via 91.

Specifically, the oxide semiconductor is a transparent metal oxide semiconductor material, and the oxide conductor is an ion-doped transparent metal oxide semiconductor material. Preferably, the transparent metal oxide semiconductor material is amorphous indium gallium zinc oxide (IGZO).

Specifically, the substrate 10 is a transparent substrate, and preferably, a glass substrate.

Specifically, the transparent conductive layer 21 and the common electrode 22 are made of a transparent conductive metal oxide material, such as one or more of stacked layers of indium tin oxide (ITO), indium zinc oxide (IZO), aluminum zinc oxide, aluminum zinc oxide, indium-zinc-germanium oxide. Preferably, the material of the transparent conductive layer and the common electrode 22 is indium tin oxide (ITO).

Specifically, the light-shielding layer 30 is made of a metal, preferably one or more stacked combination of molybdenum (Mo), titanium (Ti), aluminum (Al), copper (Cu).

Specifically, the buffer layer 40 is a silicon oxide (SiOx) layer, a silicon nitride (SiNx) layer, or a stacked compound layer formed by silicon oxide layer and silicon nitride layer.

Specifically, the gate 50 and the drain 96 are made of one or more stacked combination of molybdenum (Mo), aluminum (Al), copper (Cu), and titanium (Ti).

Specifically, the gate insulating layer 60, the first passivation layer 90 and the second passivation layer 98 are a silicon oxide (SiOx) layer, a silicon nitride (SiNx) layer, or a stacked compound layer formed by silicon oxide layer and silicon nitride layer.

The TFT substrate, manufactured by using the transparent metal oxide metal oxide material characterized by high visible light transmittance and the doping treatment of transparent metal oxide semiconductor to convert into the transparent metal oxide conductor to form simultaneously the active layer and the pixel electrode, is manufactured by a manufacturing process that is simple, low production cost, and the light-shielding layer is provided below the TFT to avoid the light to influence of TFT electrical stability.

In summary, the present invention provides a manufacturing method for TFT substrate, by using the transparent metal oxide metal oxide material characterized by high visible light transmittance and the doping treatment of transparent metal oxide semiconductor to convert into the transparent metal oxide conductor to form simultaneously the active layer and the pixel electrode, to reduce the number of masks, improve production efficiency and reduce the production cost; moreover, the use of only a semi-permeable mask for exposure and etching to form the common electrode and a stacked light-shielding layer of light-shielding layer and transparent conductive layer can further reduce the number of masks, the electric stability influenced by light is avoided by disposing the light shielding layer below the TFT. The present invention provides a TFT substrate, manufactured by using the transparent metal oxide metal oxide material characterized by high visible light transmittance and the doping treatment of transparent metal oxide semiconductor to convert into the transparent metal oxide conductor to form simultaneously the active layer and the pixel electrode, wherein the manufacturing process is simple, low production cost, and the light-shielding layer is provided below the TFT to avoid the light to influence of TFT electrical stability.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method for thin film transistor (TFT) substrate, which comprises:

Step 1: providing a substrate, and then sequentially depositing a transparent conductive film and a light-shielding film on the substrate;

Step 2: using a semi-permeable mask on the transparent conductive film and the light-shielding film for patterning process to obtain a transparent conductive layer and a common electrode spaced apart on the substrate, and a light-shielding layer over the transparent conductive layer with equal width and aligned at two ends;

Step 3: depositing a buffer layer on the light-shielding layer, the common electrode, and the substrate, and then sequentially depositing an oxide semiconductor layer, an insulating layer, and a gate metal layer on the buffer layer;

Step 4: using a mask on the gate metal layer and the insulating layer for patterning process to obtain a gate and a gate insulating layer with the same width and aligned at two ends;

using the gate and the gate insulating layer as a shielding layer to perform ion doping on the oxide semiconductor layer to convert the region of the oxide semiconductor layer not covered by the gate and the gate insulating layer into oxide conductor;

Step 5: using a mask on the oxide semiconductor layer for patterning process to form an active layer and a pixel electrode connected to the active layer;

the active layer comprising a channel region underneath the gate, a drain contact region located at one side of the channel region, a connection area located at the other side of the channel region and connected to the pixel electrode; wherein the channel region of the active layer being made of an oxide semiconductor material, the drain contact region and the connection region of the active layer, and the pixel electrode being made of an oxide conductor;

Step 6: depositing a first passivation layer on the gate, the active layer and the buffer layer, using a mask on the first passivation layer for patterning process to form a via on the first passivation layer corresponding to the drain contact region; and Step 7: depositing a drain metal layer on the first passivation layer, using a mask on the drain metal layer for patterning process to obtain a drain, the drain contacting the drain contact region of the active layer through the via, depositing a second passivation layer on the drain and the first passivation layer to form a TFT substrate.

2. The manufacturing method for TFT substrate as claimed in claim 1, wherein Step 2 further comprises:

Step 21: coating a photoresist layer on the light-shielding film, using a semi-permeable mask on the photoresist layer for patterning process to obtain a first photoresist section and a second photoresist section spaced apart; the first photoresist section having a thickness greater than the thickness of the second photoresist section;

Step 22: using the first photoresist section and the second photoresist section as a stopping layer to perform etching on the transparent conductive film and the light-shielding film to obtain the light-shielding layer and the transparent conductive layer beneath the first photoresist section, and a light-shielding section and the common electrode underneath the second photoresist section;

Step 23: performing an ashing treatment on the first and the second photoresist sections for thinning the first photoresist section and removing the second photoresist section;

Step 24: using the first photoresist section as a stopping layer to perform etching on the light-shielding section to remove the light-shielding section; and Step 25: removing the remaining first photoresist section.

3. The manufacturing method for TFT substrate as claimed in claim 1, wherein in Step 2, the semi-permeable mask is a gray tone mask, half tone mask or single slit mask.

4. The manufacturing method for TFT substrate as claimed in claim 1, wherein in Step 4, the ion doping performed on the oxide semiconductor is through plasma treatment.

5. The manufacturing method for TFT substrate as claimed in claim 1, wherein in Step 5, the oxide semiconductor is a transparent metal oxide semiconductor material, and the oxide conductor is an ion-doped transparent metal oxide semiconductor material.

6. A manufacturing method for thin film transistor (TFT) substrate, which comprises:

Step 1: providing a substrate, and then sequentially depositing a transparent conductive film and a light-shielding film on the substrate;

Step 2: using a semi-permeable mask on the transparent conductive film and the light-shielding film for patterning process to obtain a transparent conductive layer and a common electrode spaced apart on the substrate, and a light-shielding layer over the transparent conductive layer with equal width and aligned at two ends;

Step 3: depositing a buffer layer on the light-shielding layer, the common electrode, and the substrate, and then sequentially depositing an oxide semiconductor layer, an insulating layer, and a gate metal layer on the buffer layer;

Step 4: using a mask on the gate metal layer and the insulating layer for patterning process to obtain a gate and a gate insulating layer with the same width and aligned at two ends;

using the gate and the gate insulating layer as a shielding layer to perform ion doping on the oxide semiconductor layer to convert the region of the oxide semiconductor layer not covered by the gate and the gate insulating layer into oxide conductor;

Step 5: using a mask on the oxide semiconductor layer for patterning process to form an active layer and a pixel electrode connected to the active layer;

the active layer comprising a channel region underneath the gate, a drain contact region located at one side of the channel region, a connection area located at the other side of the channel region and connected to the pixel electrode; wherein the channel region of the active layer being made of an oxide semiconductor material, the drain contact region and the connection region of the active layer, and the pixel electrode being made of an oxide conductor;

Step 6: depositing a first passivation layer on the gate, the active layer and the buffer layer, using a mask on the first passivation layer for patterning process to form a via on the first passivation layer corresponding to the drain contact region; and Step 7: depositing a drain metal layer on the first passivation layer, using a mask on the drain metal layer for patterning process to obtain a drain, the drain contacting the drain contact region of the active layer through the via, depositing a second passivation layer on the drain and the first passivation layer to form a TFT substrate;

wherein Step 2 further comprising:

Step 21: coating a photoresist layer on the light-shielding film, using a semi-permeable mask on the photoresist layer for patterning process to obtain a first photoresist section and a second photoresist section spaced apart; the first photoresist section having a thickness greater than the thickness of the second photoresist section;

Step 22: using the first photoresist section and the second photoresist section as a stopping layer to perform etching on the transparent conductive film and the light-shielding film to obtain the light-shielding layer and the transparent conductive layer beneath the first photoresist section, and a light-shielding section and the common electrode underneath the second photoresist section;

Step 23: performing an ashing treatment on the first and the second photoresist sections for thinning the first photoresist section and removing the second photoresist section;

Step 24: using the first photoresist section as a stopping layer to perform etching on the light-shielding section to remove the light-shielding section; and Step 25: removing the remaining first photoresist section;

wherein in Step 2, the semi-permeable mask being a gray tone mask, half tone mask or single slit mask.

7. The manufacturing method for TFT substrate as claimed in claim 6, wherein in Step 4, the ion doping performed on the oxide semiconductor is through plasma treatment.

8. The manufacturing method for TFT substrate as claimed in claim 6, wherein in Step 5, the oxide semiconductor is a transparent metal oxide semiconductor material, and the oxide conductor is an ion-doped transparent metal oxide semiconductor material.

* * * * *